United States Patent
Breitschädel et al.

(10) Patent No.: US 7,295,628 B2
(45) Date of Patent: Nov. 13, 2007

(54) STEREO MULTIPLEX ENCODER (MPX) FOR FM TRANSMISSION

(75) Inventors: Hannes Breitschädel, Vienna (AT); Peter Schlager, Kirchberg a/d Pielach (AT)

(73) Assignee: AKG Acoustics GmbH, Wien (DE)

( * ) Notice: Subject to any disclaimer, the term of this patent is extended or adjusted under 35 U.S.C. 154(b) by 707 days.

(21) Appl. No.: 10/227,593

(22) Filed: Aug. 23, 2002

(65) Prior Publication Data
US 2003/0043932 A1    Mar. 6, 2003

(30) Foreign Application Priority Data
Aug. 24, 2001  (AT) ............... A 1352/2001

(51) Int. Cl.
*H03C 1/52* (2006.01)
*H04L 27/04* (2006.01)
(52) U.S. Cl. ..................... 375/301; 332/167
(58) Field of Classification Search ............... 375/301; 332/167
See application file for complete search history.

(56) References Cited

U.S. PATENT DOCUMENTS

| | | | |
|---|---|---|---|
| 4,565,440 A * | 1/1986 | Bloechl et al. ............ 355/27 |
| 4,771,464 A * | 9/1988 | Kadin et al. ................ 381/13 |
| 4,835,791 A | 5/1989 | Daoud | |
| 4,974,236 A * | 11/1990 | Gurcan et al. ............. 375/301 |
| 4,994,769 A * | 2/1991 | Kishi ......................... 332/170 |
| 5,047,705 A * | 9/1991 | Kishi ......................... 332/151 |
| 5,115,468 A | 5/1992 | Asahi et al. | |
| 6,272,226 B1 * | 8/2001 | Khan et al. ................. 381/4 |
| 6,724,832 B1 * | 4/2004 | Hershberger .............. 375/301 |
| 6,810,090 B1 * | 10/2004 | Perlow ....................... 375/301 |

FOREIGN PATENT DOCUMENTS

DE    4210069    9/1993

OTHER PUBLICATIONS

Tseng, Specifications of Ideal Prototype Filters for Designing Linear Phase FIR Filters, Nov. 3-6, 1996-1997, vol. 1, pp. 29-33 vol. 1; 1997 IEEE.*

* cited by examiner

*Primary Examiner*—Chieh M. Fan
*Assistant Examiner*—Freshteh N Aghdam
(74) *Attorney, Agent, or Firm*—Friedrich Kueffner

(57) ABSTRACT

A stereo multiplex encoder (MPX) for FM transmission with a digital signal processor utilizes residual sideband modulation in stereo transmission instead of the conventional double sideband modulation. The adjustment of the sampling frequency to the modulation frequency (fmod=fs/2) is carried out, so that the antialiasing filter of the DAC can be used which produces the residual sideband modulated signal.

2 Claims, 3 Drawing Sheets

STEREO MULTIPLEX ENCODER (MPX) FOR FM TRANSMISSION

BACKGROUND OF THE INVENTION

1. Field of the Invention

The present invention relates to the implementation of a stereo multiplex encoder (MPX) for FM transmission with a digital signal processor.

2. Description of the Related Art

Methods of the above-described type are known, for example, from U.S. Pat. Nos. 4,835,791 and 5,115,468 and DE 42 10 069 A. For preventing aliasing, all these references utilize either a Hilbert transformer or a PSN (Phase Shift Network) and, thus, a method which is also computer-bound.

SUMMARY OF THE INVENTION

It is the object of the present invention to provide a method which is significantly less computer-bound without reducing the quality as a result.

In accordance with the present invention, the following innovations are utilized:

1. Use of the residual sideband modulation instead of the conventional double sideband modulation for stereo transmission.

2. Adjustment of the sampling frequency to the modulation frequency (fmod=fs/2). Processing of the data takes place at a sampling frequency of 76 kHz. This makes it possible to utilize the antialiasing filter of DAC which produces a residual sideband modulated signal.

3. By selecting the modulation and scanning frequency in this application, the resulting aliasing products lead automatically to the necessary increase of the level of the lower sideband.

4. Improvement of the frequency-dependent channel separation between left and right by alignment of the phase of the pilot tone and level adjustment of the center signal. This makes it possible to compensate the ripple and phase non-linearities in the antialiasing filter of the DAC.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

DETAILED DESCRIPTION OF THE INVENTION

Theoretical Basics:

By selecting the scanning rate and the modulation frequency (amplitude modulation), aliasing effects are produced intentionally which finally result in the desired modulation signal.

Figure 1:
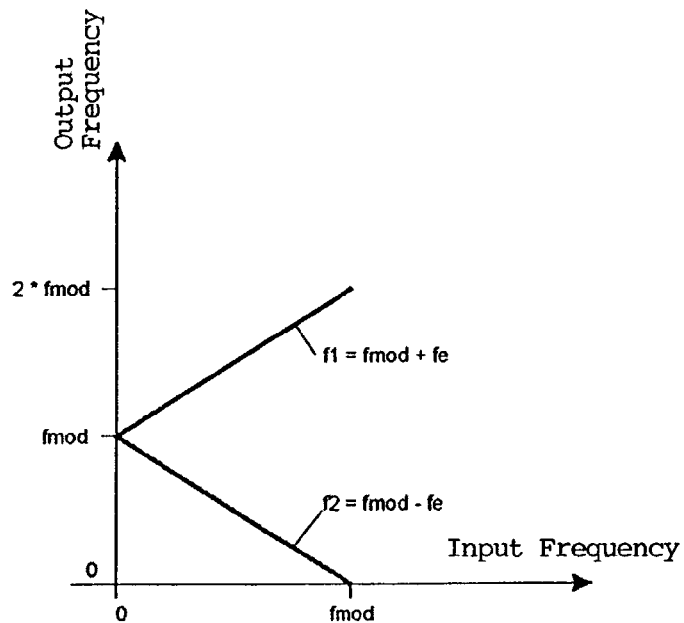
FIG. 1 is a diagram showing the function of the output frequency in dependence on the input frequency in amplitude modulation.

Amplitude Modulation:

As seen in FIG. 1, by carrying out the amplitude modulation of an analog signal with the frequency fe and the modulation frequency fmod, a spectrum is produced with the following frequencies $$f1 = fmod - fe$$

$$f2 = fmod + fe$$

Scanning:

When scanning an analog signal with an analog digital converter (ADC) without antialiasing filter, the following relationship between input and output signal frequencies results:

Up to half the scanning frequency (input signal) the sequence at the output of the ADC exactly represents the sequence of the input signal. When the input frequency is further increased, the frequency of the output sequence once again drops. Aliasing occurs.

Figure 2:
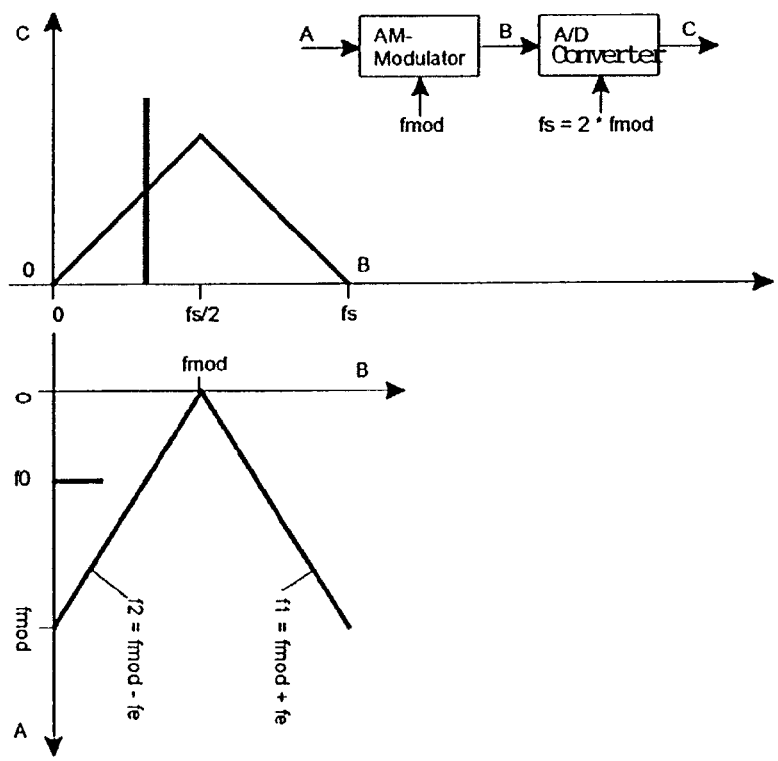
FIG. 2 is a diagram showing the increase of the amplitude of the lower sideband when scanning an amplitude-modulated signal with the scanning frequency fmod=fs/2.

Coupling of Modulation and Scanning:

The amplitude-modulated signal is scanned. Once the scanning frequency is twice the modulation frequency, aliasing occurs for the upper sideband of the amplitude-modulated signal, wherein the upper sideband is mirrored into the lower sideband. The phase difference is zero; therefore, the double amplitude results for the lower sideband, as seen in FIG. 2.

It is not necessary to increase the sideband as it is necessary in SSB (Single Sideband) modulation using the filter method.

Digital/Analog Conversion:

The spectrum of the number sequence produced according to the above-described method is periodic. The spectrum of the baseband (0-38 kHz) is periodically convoluted with a multiple of the scanning frequency (76 kHz).

Figure 3:
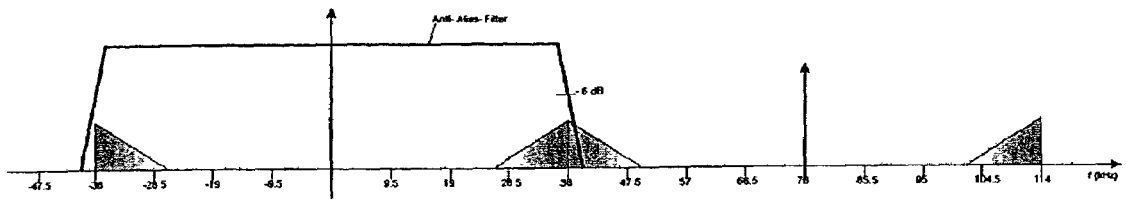
FIG. 3 is a diagram showing the resulting spectrum when scanning an amplitude-modulated signal.

Each digital analog converter (DAC) has at the output thereof a low-pass filter which tunes out the undesired frequency and only leaves the baseband. The antialiasing filter of a DAC is configured in such a way that it has precisely 6 dB attenuation at half the scanning frequency. The range of about 38 kHz is of interest. Due to the periodicity of the spectrum, the single sideband modulation has once again become a double sideband modulation. Consequently, as shown in FIG. 3, a residual sideband modulation can be measured at the analog output. The filter allows half of the original portion to pass relative to the carrier frequency and has a filter characteristic which results in an uneven symmetry in the amplitudes of the upper and lower sidebands. This uneven filtering has the result that during demodulation the values of the two sidebands add up to the correct baseband signal for all modulation frequencies.

Figure 4:
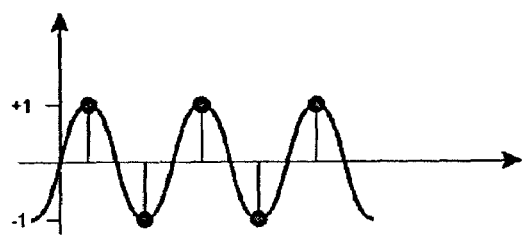
FIG. 4 is a diagram showing the production of the modulator at a scanning frequency fs=2*fmod.

Modulator:

In standard MPX, the modulator is a sinus signal with 38 kHz. When the above-described method is used, the scanning rate must be 76 kHz. As seen in FIG. 4, with a sinus of the frequency 38 kHz, scanned at a frequency of 76 kHz, the sequence is "+1" and "−1".

Figure 5:
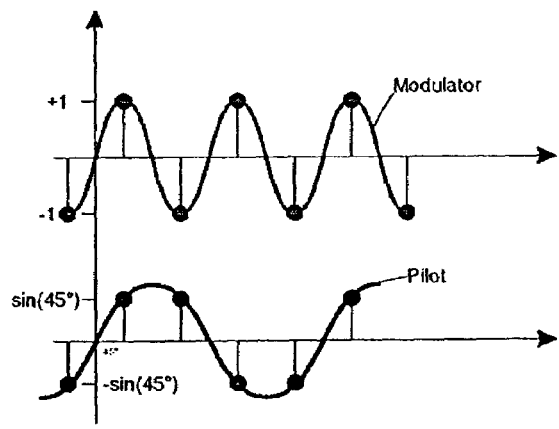
FIG. 5 is a diagram showing the production of the pilot tone with the frequency 19 kHz at a modulation frequency fmod=38 kHz and a scanning rate fs=76 kHz.

Pilot tone:

The pilot tone has exactly half the frequency of the modulator and is in locked phase relation at 0°. The phase position of the pilot tone can be aligned. This relationship results in four samples of the pilot tone, as seen in FIG. 5. The level of the pilot tone is 10% of the maximum modulation level.

$$s_1 = A \cdot \sin(45° + \phi)$$

$$s_2 = A \cdot \sin(135° + \phi)$$

$$s_3 = A \cdot \sin(225° + \phi)$$

$$s_4 = A \cdot \sin(315° + \phi)$$

wherein
$s_1 \ldots s_4$ are the four different pilot samples,
A is the amplitude
$\phi$ is the phase offset.

Figure 6:
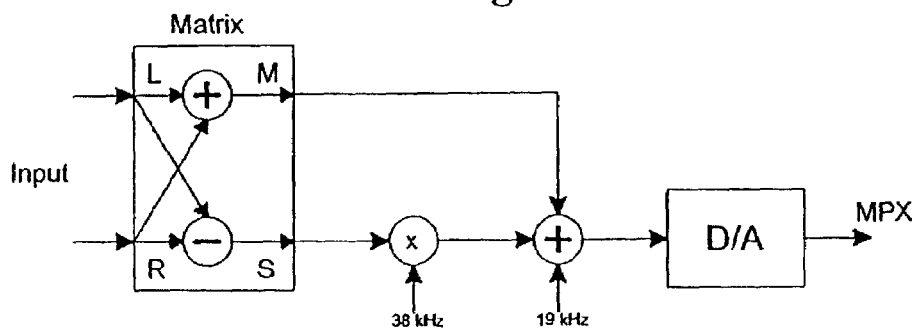
FIG. 6 is a diagram showing the production of the multiplex signal from the left and right stereo signal.

Multiplex Signal:

Two digital number sequences (left, right) with a sample rate of 76 kHz arrive at the input. As seen in FIG. 6, a matrix produces from the number sequences the central signal and side signal:

$$M = L + R$$

$$S + L - R$$

As mentioned above, the modulator is a number sequence +1, −1, +1, .... Consequently, after modulation, the following sequence results for the side signal $$+S = L - R$$

$$-S = -L + R$$

$$+S = L - R$$

etc.

After modulation, the sideband is in the frequency range of 22 to 38 kHz. The sequence of the modulated sideband signal is added to form the central signal.

$$M+S = M+(L-R) = (L+R)+(L-R) = 2L$$
$$M-S = M-(L-R) = (L+R)-(L-R) = 2R$$
$$M+S = M+(L-R) = (L+R)+(L-R) = 2L$$
etc.

Figure 7:
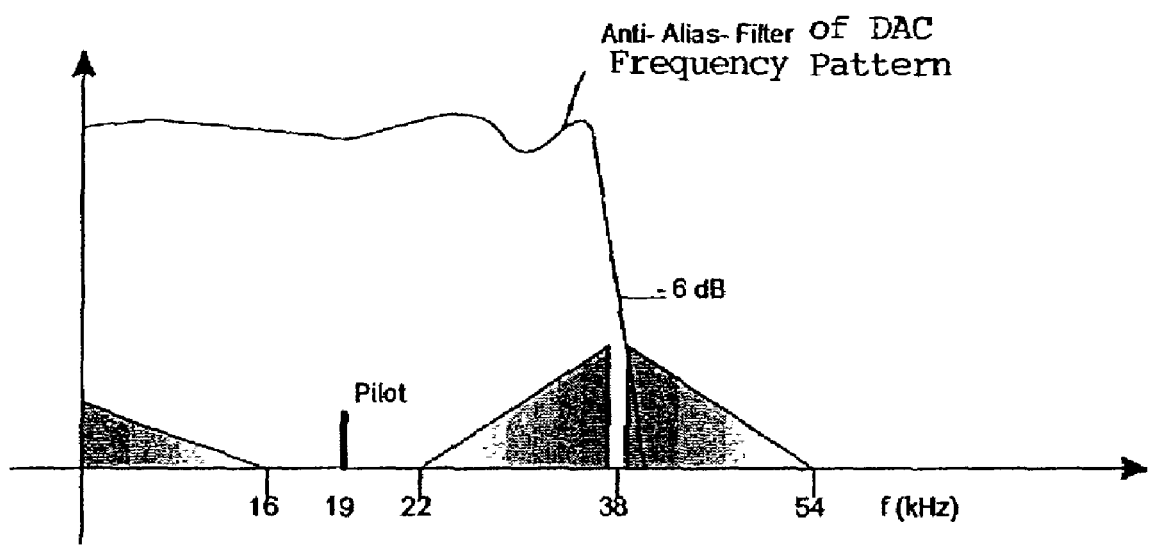
FIG. 7 is a diagram showing a real antialiasing filter (ripples can be seen in the passage area of the antialiasing filter).

This shows that, instead of using the matrix with subsequent modulator, it is also possible to use a switch which is switched between 2L and 2R. In order to compensate the filter ripple of the DAC shown in FIG. 7, the level of the center signal has to be slightly decreased. If this alignment is not used (switch method), a simpler algorithm is obtained, but with a poorer channel separation.

The modulation in the DSP is computed by alternating addition and subtraction of the side signal from the center signal. In order to obtain the complete multiplex signal, the pilot tone has to be added. Four periodically repeated coefficients are obtained for the pilot tone. These coefficients are stored in a table.

In summary, the number sequence of the multiplex signal results as follows $$MPX_1 = M_1 + S_1 + pilot_1$$

$$MPX_2 = M_2 - S_2 + pilot_2$$

$$MPX_3 = M_3 + S_3 + pilot_3$$

$$MPX_4 = M_4 + S_4 + pilot_4$$

$$MPX_5 = M_5 + S_5 + pilot_5$$

wherein
$MPX_1 \ldots$ is the number sequence of the multiplex signals,
$M_1 \ldots$ is the number sequence of the center signal,
$S_1 \ldots$ is the number sequence of the side signal,
$pilot_1 \ldots pilot_4$ is the number sequence of the four pilot coefficients (periodic)

Modulator Alignment to a DAC:

All of the above considerations start from an ideal antialiasing low-pass in the DAC. However, real low-passes have a waviness in the passage area as well as a non-constant group travel time.

The waviness has the following result: For recovering the L, R signal from the M, S signal, the inverse matrix has to be formed.

$$2L = M+S = (L+R)+(L-R)$$

$$2R = M-S = (L+R)-(L-R)$$

The side signal is located in a frequency range which differs from that of the center signal. Due to deviations of the side signal level of 0 dB because of waviness of the antialiasing filter, the inverse matrix no longer operates exactly and channel crosstalk occurs. Similar conditions apply to the constancy of the group travel time (linearity of the phase). Accordingly, the effects of the antialiasing low-pass filter of the DAC result in a frequency-dependent channel separation. In order to compensate for these effects, the phase of the pilot tone and the level of the center signal can be aligned.

The invention is not limited by the embodiments described above which are presented as examples only but can be modified in various ways within the scope of protection defined by the appended patent claims.

What is claimed is:

1. A method of operating a stereo multiplex encoder for FM transmission using a digital signal processor and a Digital-Analog-Converter operatively connected to the digital signal processor, the method comprising; carrying out amplitude modulation of an analog signal with a modulation frequency (fmod) and sampling the amplitude modulated signal with a sampling frequency (fs), wherein the sampling frequency (fs) is twice the modulation frequency (fmod); and generating a residual sideband modulated signal from the sample signal by means of an antialiasing filter of the Digital-Analog-Converter, wherein the filter of the Digital-Analog-Converter has a filter characteristic of an odd symmetry and an attenuation of 6 dB at said modulation frequency.

2. The method according to claim 1, wherein a frequency-dependent channel separation between left and right is effected by aligning the phases of the pilot tone and level adjustment of the center signal, whereby ripple and phase non-linearities in the antialiasing filter of the Digital-Analog-Converter can be compensated.

* * * * *